United States Patent
Khlat

(10) Patent No.: US 9,595,981 B2
(45) Date of Patent: Mar. 14, 2017

(54) REDUCED BANDWIDTH ENVELOPE TRACKING

(71) Applicant: RF Micro Devices, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 14/836,634

(22) Filed: Aug. 26, 2015

(65) Prior Publication Data

US 2016/0065137 A1  Mar. 3, 2016

Related U.S. Application Data

(60) Provisional application No. 62/041,796, filed on Aug. 26, 2014.

(51) Int. Cl.
| | |
|---|---|
| *H04B 1/04* | (2006.01) |
| *H03F 3/19* | (2006.01) |
| *H03F 1/02* | (2006.01) |
| *H03F 1/32* | (2006.01) |
| *H03F 3/24* | (2006.01) |

(52) U.S. Cl.
CPC ......... *H04B 1/0475* (2013.01); *H03F 1/0227* (2013.01); *H03F 1/3241* (2013.01); *H03F 3/19* (2013.01); *H03F 3/245* (2013.01); *H03F 2200/102* (2013.01); *H03F 2200/451* (2013.01); *H04B 2001/0416* (2013.01)

(58) Field of Classification Search
CPC ......... H03F 1/02; H03F 1/3247; H03F 1/0227
USPC ............ 455/127.1, 127.2, 138, 232.1, 245.1, 455/114.3, 194.2, 341
See application file for complete search history.

(56) References Cited

U.S. PATENT DOCUMENTS

| | | | |
|---|---|---|---|
| 7,043,213 B2 * | 5/2006 | Robinson | H03F 1/0222 330/10 |
| 7,570,931 B2 * | 8/2009 | McCallister | H03C 5/00 455/126 |
| 8,461,928 B2 | 6/2013 | Yahav et al. | |
| 8,989,682 B2 | 3/2015 | Ripley et al. | |
| (Continued) | | | |

OTHER PUBLICATIONS

Non-Final Office Action for U.S. Appl. No. 14/868,890, mailed Jul. 14, 2016, 13 pages.

*Primary Examiner* — Sonny Trinh
(74) *Attorney, Agent, or Firm* — Withrow & Terranova, P.L.L.C.

(57) ABSTRACT

Envelope power supply circuitry includes an envelope power converter circuitry and envelope tracking circuitry. The envelope power converter circuitry receives an envelope power converter control signal from the envelope tracking circuitry and a supply voltage and provides an envelope power supply signal for an amplifier based thereon. In a first mode of operation, the envelope power converter control signal is provided such that the envelope power supply signal causes the gain of the amplifier to remain substantially constant over a range of input power provided to the amplifier. In a second mode of operation, the envelope power converter control signal is provided such that the envelope power supply signal remains substantially constant for values within the range of input power below a predetermined threshold, and such that the envelope power supply signal causes the gain of the amplifier to remain substantially constant for other values.

20 Claims, 8 Drawing Sheets

(56) References Cited

U.S. PATENT DOCUMENTS

| | | | |
|---|---|---|---|
| 9,166,830 B2 * | 10/2015 | Camuffo | H03F 1/02 |
| 9,225,362 B2 | 12/2015 | Drogi et al. | |
| 9,263,997 B2 * | 2/2016 | Vinayak | H03F 1/0233 |
| 9,356,512 B2 | 5/2016 | Chowdhury et al. | |
| 2016/0099687 A1 | 4/2016 | Khlat | |

* cited by examiner

| OPERATING BAND | UPLINK (UL) OPERATING BAND | DOWNLINK (DL) OPERATING BAND | DUPLEX MODE |
|---|---|---|---|
| 1 | 1920-1980 | 2110-2170 | FDD |
| 2 | 1850-1910 | 1920-1990 | FDD |
| 3 | 1710-1785 | 1805-1880 | FDD |
| 4 | 1710-1755 | 2110-2155 | FDD |
| 5 | 824-849 | 869-894 | FDD |
| 6 | 830-840 | 865-875 | FDD |
| 7 | 2500-2570 | 2620-2690 | FDD |
| 8 | 880-915 | 925-960 | FDD |
| 9 | 1749.9-1784.9 | 1844.9-1879.9 | FDD |
| 10 | 1710-1770 | 2110-2170 | FDD |
| 11 | 1427.9-1447.9 | 1475.9-1495.9 | FDD |
| 12 | 698-716 | 728-746 | FDD |
| 13 | 777-787 | 746-756 | FDD |
| 14 | 788-798 | 758-768 | FDD |
| 15 | RESERVED | RESERVED | - |
| 16 | RESERVED | RESERVED | - |
| 17 | 704-716 | 734-746 | FDD |
| 18 | 815-830 | 860-875 | FDD |
| 19 | 830-845 | 875-890 | FDD |
| 20 | 832-862 | 791-821 | FDD |
| 21 | 1447.9-1462.9 | 1495.9-1510.9 | FDD |
| 22 | 3410-3500 | 3510-3600 | FDD |
| ... | ... | ... | ... |
| 33 | 1900-1920 | 1900-1920 | TDD |
| 34 | 2010-2025 | 2010-2025 | TDD |
| 35 | 1850-1910 | 1850-1910 | TDD |
| 36 | 1930-1990 | 1930-1990 | TDD |
| 37 | 1910-1930 | 1910-1930 | TDD |
| 38 | 2570-2620 | 2570-2620 | TDD |
| 39 | 1880-1920 | 1880-1920 | TDD |
| 40 | 2300-2400 | 2300-2400 | TDD |
| 41 | 3400-3600 | 3400-3600 | TDD |

*FIG. 1*
*(RELATED ART)*

REDUCED BANDWIDTH ENVELOPE TRACKING

RELATED APPLICATIONS

This application claims the benefit of U.S. provisional patent application No. 62/041,796, filed Aug. 26, 2014, the disclosure of which is incorporated herein by reference in its entirety.

FIELD OF THE DISCLOSURE

The present disclosure relates to envelope tracking systems for radio frequency (RF) amplifiers.

BACKGROUND

Modern mobile telecommunications standards continue to demand increasingly greater rates of data exchange (data rates). One way to achieve a high data rate in a mobile device is through the use of carrier aggregation. Carrier aggregation allows a mobile device to aggregate bandwidth across one or more operating bands in the wireless spectrum. The increased bandwidth achieved as a result of carrier aggregation allows a mobile device to obtain higher data rates than have previously been available.

FIG. 1 is a table describing a number of wireless operating bands in the wireless spectrum. One or more of the wireless operating bands may be used, for example, in a code division multiple access (CDMA), global system for mobile communications (GSM), long term evolution (LTE), or LTE-advanced equipped mobile device. The first column indicates the operating band number for each one of the operating bands. The second and third columns indicate the uplink and downlink frequency bands for each one of the operating bands, respectively. Finally, the fourth column indicates the duplex mode for each one of the operating bands. In non-carrier aggregation configurations, a mobile device will generally communicate using a single portion of the uplink or downlink frequency bands within a single operating band. In carrier aggregation applications, however, a mobile device may aggregate bandwidth across a single operating band or multiple operating bands in order to increase the data rate of the device.

FIG. 2A is a diagram illustrating a conventional, non-carrier aggregation configuration for a mobile device. In the conventional configuration, a mobile device communicates using a single portion (e.g., a resource block in LTE terminology) of a wireless spectrum 10 within a single operating band 12. Under the conventional approach, the data rate of the mobile device is constrained by the limited available bandwidth.

FIGS. 2B-2D are diagrams illustrating a variety of carrier aggregation configurations for a mobile device. FIG. 2B shows an example of contiguous, intra-band carrier aggregation, in which the aggregated portions of the wireless spectrum 14A and 14B are located directly adjacent to one another and are in the same operating band 16. FIG. 2C shows an example of non-contiguous intra-band carrier aggregation, in which the aggregated portions of the wireless spectrum 18A and 18B are located within the same operating band 20, but are not directly adjacent to one another. Finally, FIG. 2D shows an example of inter-band carrier aggregation, in which a first portion of the wireless spectrum 22A is located in a first operating band 24 and a second portion of the wireless spectrum 22B is located in a second operating band 26. It is advantageous for a mobile device to support each one of the previously described carrier aggregation configurations.

The use of carrier aggregation may pose unique problems for the front end and/or RF amplification circuitry in a mobile device. For instance, certain carrier aggregation configurations may require specialized hardware and/or software to implement.

In addition to greater data rates, consumer demand for longer battery life from mobile devices has resulted in the development of many power-saving techniques. One way to conserve power in a mobile device is through the use of envelope tracking. Envelope tracking involves modulating a supply voltage provided to an amplifier based on the instantaneous magnitude (i.e., the envelope) of an RF input signal provided to the amplifier. FIG. 3 illustrates the basics of envelope tracking. Specifically, FIG. 3 shows an amplitude-modulated RF signal 28. Conventionally, a constant supply voltage at a level sufficient to ensure adequate headroom across the entire amplitude (input power) range of the RF signal 28 would be supplied to an RF amplifier, as shown by line 30. This results in a significant amount of wasted energy when the amplitude of the RF carrier is low, as illustrated by line 32. Accordingly, an envelope tracking power supply signal tracks the amplitude of the RF signal 28, as illustrated by line 34, and therefore saves significant amounts of energy.

While envelope tracking has been increasingly utilized, it often requires specialized hardware to accomplish. This hardware must be capable of providing the modulated supply voltage at a frequency high enough to keep up with changes in the amplitude of the RF signal. Generally, this requires an envelope tracking power supply to be capable of operating at frequencies around two to three times that of the modulation bandwidth of the RF signal. In situations where the modulation bandwidth of the RF signal is high, for example, in non-contiguous intra-band carrier aggregation configurations, hardware limitations may make it difficult to achieve such high speeds.

Conventional approaches to the aforementioned problems have generally focused on using average power tracking during the amplification of wide modulation bandwidth RF signals. Average power tracking involves providing an unmodulated (i.e., constant) supply voltage to an RF amplifier. As mentioned above, the magnitude of a supply voltage in an average power tracking approach must be high enough to ensure adequate headroom to avoid compression of the RF signal. Accordingly, this often means that a relatively large supply voltage must be provided to the RF amplifier. The envelope power converter circuitry in an envelope power supply is generally designed to provide a large supply voltage only for short periods of time in order to increase the efficiency thereof. In other words, envelope power supplies generally are not capable of sustaining the relatively large supply voltage required by an average power tracking approach. Accordingly, an additional power supply is required to use both envelope tracking and average power tracking together, or the components of the envelope power converter circuitry must be modified to support the continuous output of a large voltage, which will generally degrade the efficiency of the supply.

In light of the above, there is a present need for an improved envelope tracking method and system capable of efficiently operating with high bandwidth RF signals.

SUMMARY

The present disclosure relates to envelope tracking systems for radio frequency (RF) amplifiers. In one embodiment, envelope power supply circuitry includes an envelope power converter circuitry and envelope tracking circuitry. The envelope power converter circuitry receives an envelope power converter control signal and a supply voltage and provides an envelope power supply signal for an amplifier based on the envelope power converter control signal and the supply voltage. The envelope tracking circuitry provides the envelope power converter control signal to the envelope power converter circuitry. In a first mode of operation, the envelope power converter control signal is provided such that the envelope power supply signal causes the gain of the amplifier to remain substantially constant over a range of input power provided to the amplifier. In a second mode of operation, the envelope power converter control signal is provided such that the envelope power supply signal remains substantially constant for values within the range of input power below a predetermined threshold, and such that the envelope power supply signal causes the gain of the amplifier to remain substantially constant for values within the range of input power above the predetermined threshold. By providing the envelope power converter control signal as indicated in the second mode of operation, wide modulation bandwidth RF input signals such as non-contiguous intra-band carrier aggregation signals may be amplified by the amplifier using the envelope power supply circuitry.

In one embodiment, the envelope tracking circuitry includes a gain-shaping look-up table. The gain-shaping look-up table receives an envelope tracking signal and provides the envelope power converter control signal. Envelope detection circuitry may provide the envelope tracking signal to the gain-shaping look-up table.

In one embodiment, the envelope power converter circuitry includes a first control amplifier and a second control amplifier. The first control amplifier receives the envelope power converter control signal and provides a first control amplifier output signal, which determines a magnitude of the envelope power supply signal in the first mode of operation. The second amplifier receives the envelope power converter control signal and provides a second control output signal, which determines a magnitude of the envelope power supply signal in the second mode of operation. The second control amplifier is configured to operate at a lower supply voltage than the first control amplifier. Since the voltage swing of the envelope power converter circuitry is less in the second mode of operation, using the second control amplifier with a reduced supply voltage allows the envelope power converter circuitry to adequately provide the envelope power supply signal with increased efficiency.

In one embodiment, an RF transmitter includes modulator circuitry, distortion compensation circuitry, an amplifier, front end circuitry, and envelope power supply circuitry. The modulator circuitry receives a baseband signal and provides a modulated input signal. The distortion compensation circuitry receives the modulated input signal and performs distortion compensation thereon to provide an RF input signal. The amplifier receives and amplifies the RF input signal to provide an RF output signal. The front end circuitry receives the RF output signal and provides the RF output signal to an antenna for transmission. The envelope power supply circuitry includes an envelope power converter circuitry and envelope tracking circuitry. The envelope power converter circuitry receives an envelope power converter control signal and a supply voltage and provides an envelope power supply signal for an amplifier based on the envelope power converter control signal and the supply voltage. The envelope tracking circuitry provides the envelope tracking signal to the envelope power supply circuitry. In a first mode of operation, the envelope power converter control signal is provided such that the envelope power supply signal causes the gain of the amplifier to remain substantially constant over a range of input power provided to the amplifier. In a second mode of operation, the envelope power converter control signal is provided such that the envelope power supply signal remains substantially constant for values within the range of input power below a predetermined threshold, and such that the envelope power supply signal causes the gain of the amplifier to remain substantially constant for values within the range of input power above the predetermined threshold. By providing the envelope power converter control signal as indicated in the second mode of operation, wide modulation bandwidth RF input signals such as non-contiguous intra-band carrier aggregation signals may be amplified by the amplifier using the envelope power supply circuitry.

In one embodiment, the envelope tracking circuitry includes a gain-shaping look-up table. The gain-shaping look-up table receives an envelope tracking signal and provides the envelope power converter control signal. Envelope detection circuitry may provide the envelope tracking signal to the gain-shaping look-up table.

In one embodiment, the envelope power converter circuitry includes a first control amplifier and a second control amplifier. The first control amplifier receives the envelope power converter control signal and provides a first control amplifier output signal, which determines a magnitude of the envelope power supply signal in the first mode of operation. The second amplifier receives the envelope power converter control signal and provides a second control output signal, which determines a magnitude of the envelope power supply signal in the second mode of operation. The second control amplifier is configured to operate at a lower supply voltage than the first control amplifier. Since the voltage swing of the envelope power converter circuitry is less in the second mode of operation, using the second control amplifier with a reduced supply voltage allows the envelope power converter circuitry to adequately provide the envelope power supply signal with increased efficiency.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

FIG. 1 is a table describing a number of operating bands within the wireless spectrum.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Figure 4:
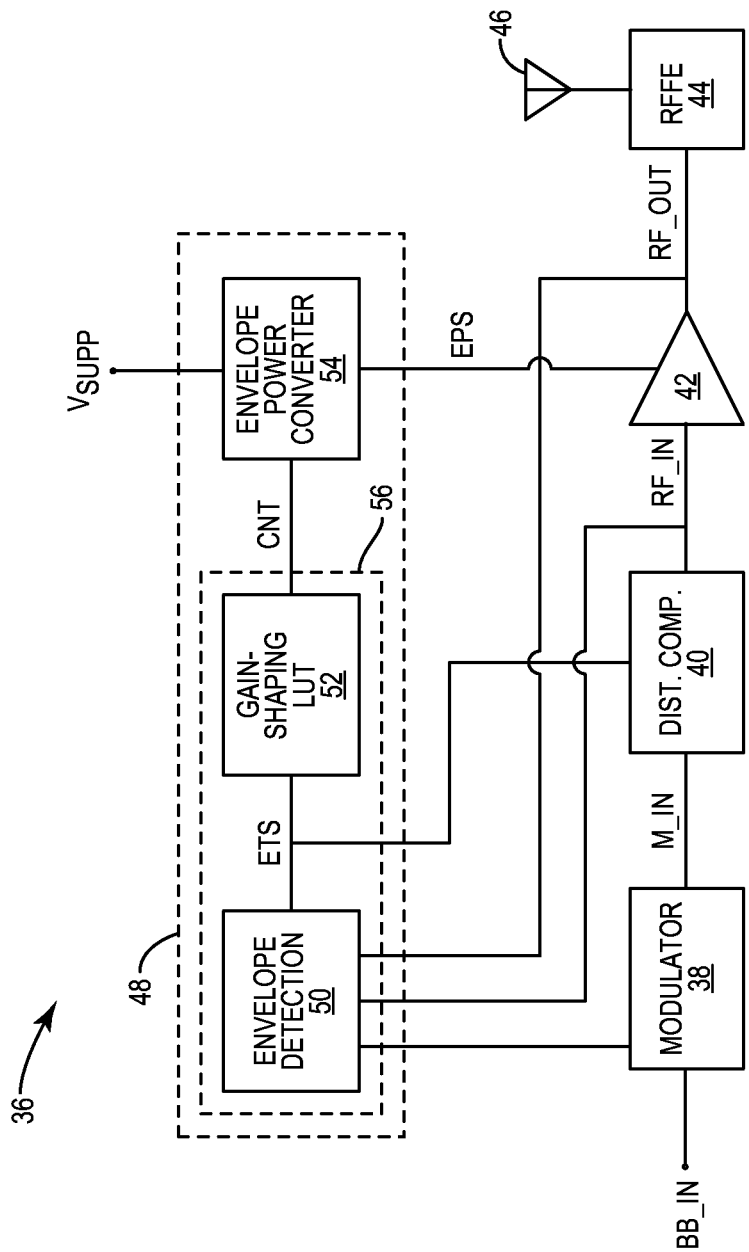
FIG. 4 is a diagram illustrating a radio frequency (RF) transmitter according to one embodiment of the present disclosure.

FIG. 4 is a diagram of a radio frequency (RF) transmitter 36 according to one embodiment of the present disclosure. The RF transmitter 36 includes modulator circuitry 38 configured to receive a baseband input signal BB_IN and provide a modulated input signal M_IN to distortion compensation circuitry 40. The distortion compensation circuitry 40 in turn performs distortion compensation on the modulated input signal M_IN to provide an RF input signal RF_IN to an input of an RF amplifier 42. The RF amplifier 42 amplifies the RF input signal RF_IN using an envelope power supply signal EPS to provide an RF output signal RF_OUT to RF front end circuitry 44. The RF front end circuitry 44 may appropriately filter the RF output signal RF_OUT and provide the signal to an antenna 46, which may be one of a number of antennas (not shown for purposes of clarity).

Envelope power supply circuitry 48 is coupled to one or more of the modulator circuitry 38, the input of the RF amplifier 42, and the output of the RF amplifier 42. The envelope power supply circuitry 48 includes envelope detection circuitry 50, a gain-shaping look-up table 52, and envelope power converter circuitry 54. Together, the envelope detection circuitry 50 and the gain-shaping look-up table 52 are referred to as envelope tracking circuitry 56. The envelope detection circuitry 50 may receive one or more of an envelope signal from the modulator (e.g., an in-phase component and a quadrature component of the baseband input signal BB_IN), the RF input signal RF_IN, and the RF output signal RF_OUT, and provide an envelope tracking signal ETS to the gain-shaping look-up table 52. The gain-shaping look-up table 52 receives the envelope tracking signal ETS and provides a gain-shaped envelope tracking signal ETS, referred to as an envelope power converter control signal CNT, to the envelope power converter circuitry 54 based thereon. The envelope power converter circuitry 54 receives the control signal CNT and a supply voltage V_SUPP and provides the envelope power supply signal EPS based thereon.

The envelope power supply circuitry 48 is configured to operate in a first mode of operation and a second mode of operation. In the first mode of operation of the envelope power supply circuitry 48, the gain-shaping look-up table 52 provides the envelope power converter control signal CNT such that the envelope power supply signal EPS causes the gain of the RF amplifier 42 to remain substantially constant regardless of the input power provided to the RF amplifier 42. As will be appreciated by those of ordinary skill in the art, the gain of the RF amplifier 42 is dependent on both input power and supply voltage. In other words, changing either the input power of the RF amplifier 42 or the supply voltage provided to the RF amplifier 42 may also change the gain of the amplifier. This may in turn cause amplitude modulation (AM) to AM distortion in the RF output signal RF_OUT, especially when the RF amplifier 42 is operated using an envelope power supply modulation scheme. One way to avoid this AM to AM distortion is by providing the envelope power supply signal EPS according to an isogain contour of the RF amplifier 42. An isogain contour defines a relationship between input power and power supply voltage for an amplifier that will produce a substantially constant gain. Providing a supply voltage to an amplifier using an isogain contour allows the gain of the amplifier to remain substantially constant over most if not all of the range of input power provided to the amplifier, thereby significantly reducing or eliminating AM to AM distortion in an RF output signal due to envelope power supply modulation.

In the second mode of operation of the envelope power supply circuitry 48, the gain-shaping look-up table 52 provides the envelope power converter control signal CNT such that the envelope power supply signal EPS is substantially constant (at a predetermined supply voltage) when the input power provided to the RF amplifier 42 is below a predetermined input power threshold. In other words, the RF amplifier 42 is operated in average power tracking mode such that the envelope power supply signal EPS is a constant voltage. When the input power provided to the RF amplifier 42 is above the predetermined input power threshold, the gain-shaping look-up table 52 provides the envelope power converter control signal CNT such that the gain of the RF amplifier 42 remains substantially constant. In other words, when the input power provided to the RF amplifier 42 is above the predetermined input power threshold, the gain-shaping look-up table provides the envelope power converter control signal CNT such that the envelope power supply signal follows an isogain contour of the RF amplifier 42.

In general, the envelope power supply circuitry 48 should be capable of providing the envelope power supply signal EPS at frequencies that are two to three times larger than the modulation bandwidth of the RF input signal RF_IN. Accordingly, providing the envelope power supply signal EPS based on one or more isogain curves such that the gain of the RF amplifier 42 remains constant across the input power range of the RF input signal RF_IN may be impractical in circumstances in which the RF input signal RF_IN has a wide modulation bandwidth. For example, in non-contiguous intra-band carrier aggregation configurations wherein the modulation bandwidth of the RF input signal may be very large, physical limitations in the envelope power converter circuitry 54 may limit the frequency of the envelope power supply signal EPS such that the signal does not accurately track the envelope of the RF input signal RF_IN. This may cause significant distortion in the RF output signal RF_OUT.

Accordingly, the envelope power supply circuitry 48 may normally operate in the first mode of operation and transition to the second mode of operation when performing non-contiguous carrier aggregation. Operating in the second mode of operation effectively reduces the dynamic range of the envelope power supply signal EPS, which in turn reduces the required frequency of operation of the envelope power supply circuitry 48. As discussed above, the envelope power converter circuitry 54 may be unable to maintain the envelope power supply signal EPS at a voltage sufficient to maintain adequate headroom across the entire amplitude range of the RF input signal RF_IN for prolonged periods of time. If the envelope power converter circuitry 54 were redesigned to be capable of providing the envelope power supply signal EPS as described for prolonged periods of time, the efficiency of the circuitry would be significantly degraded. The second mode of operation utilizes a hybrid average power tracking and envelope tracking approach to provide a constant voltage (the predetermined supply voltage) such that the envelope power converter circuitry 54 is capable of sustaining the constant voltage for prolonged periods, while temporarily providing additional voltage for shorter durations. In one embodiment, the predetermined supply voltage is between 3.5V and 4V.

As will be appreciated by those of ordinary skill in the art, the gain of the RF amplifier 42 in the second mode of operation will no longer be constant due to the fact that the envelope power supply signal EPS is not provided according to an isogain contour. Accordingly, significant AM to AM distortion may be present in the RF output signal RF_OUT in the second mode of operation. In order to compensate for this fact, the distortion compensation circuitry 40 performs distortion compensation on the modulated input signal M_IN using the envelope tracking signal ETS and a look-up table stored therein (not shown). The distortion compensation circuitry 40 may be programmed using calibration data obtained during manufacture of the RF transmitter 36, or may adaptively control the distortion compensation. Notably, the distortion compensation circuitry 40 may be active during both the first mode of operation and the second mode of operation of the envelope power supply circuitry 48. However, the distortion compensation provided by the distortion compensation circuitry 40 will change based on the mode of operation. In one embodiment, a look-up table stores distortion compensation values to be used in the first mode of operation and the second mode of operation, respectively, and switches between the values based on the particular mode of operation. In general, the distortion compensation circuitry 40 provides pre-distortion in the RF input signal RF_IN to linearize the gain response of the RF amplifier 42.

Figure 5:
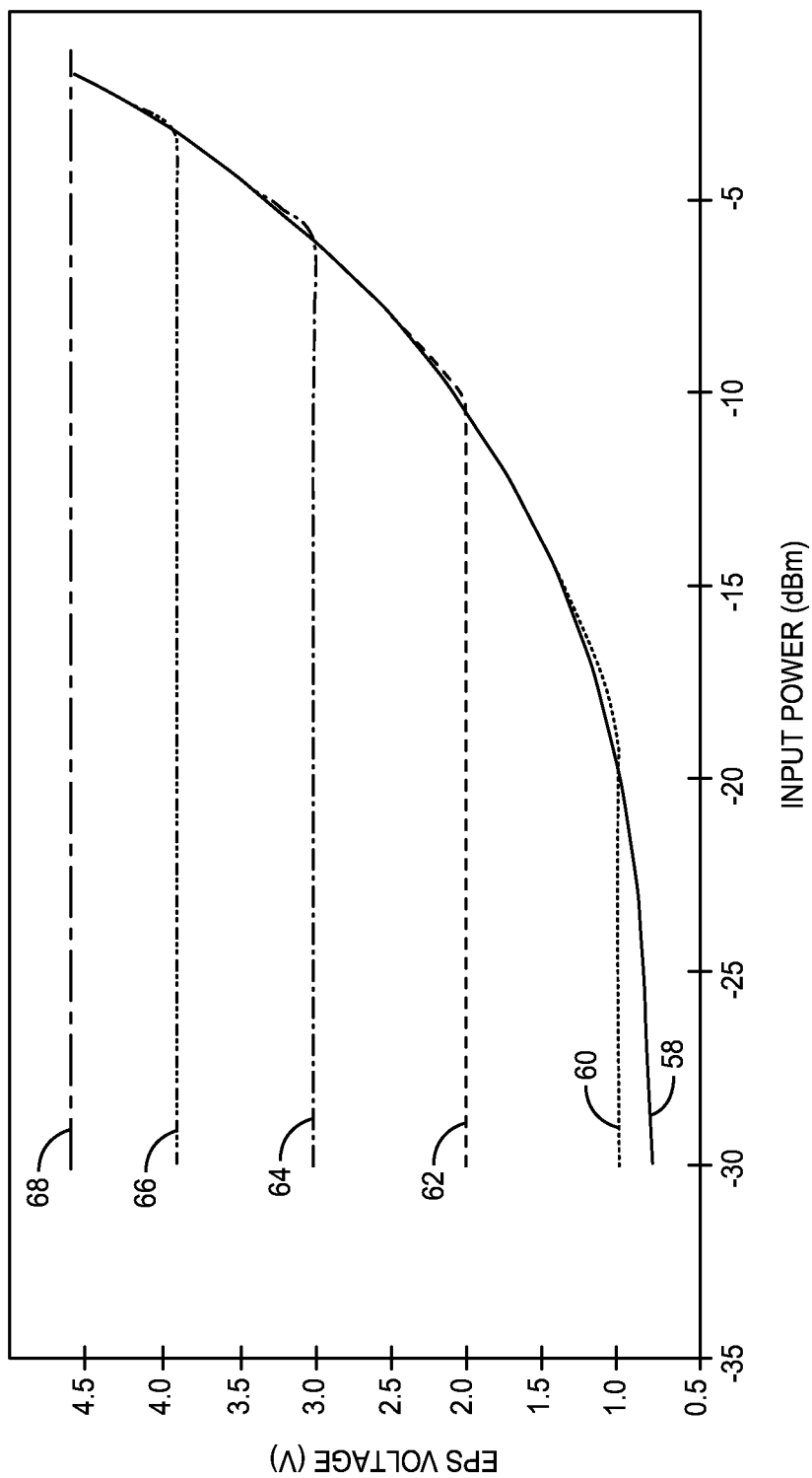
FIG. 5 is a graph illustrating a power modulation technique according to one embodiment of the present disclosure.

FIG. 5 is a graph illustrating the concepts described above. Specifically, FIG. 5 shows the voltage of the envelope power supply signal EPS for a variety of input power levels of the RF input signal RF_IN. A full bandwidth curve 58 is shown as a solid line. The full bandwidth curve 58 represents the typical values of the envelope power supply signal EPS, and is based on one or more isogain contours of the RF amplifier 42 such that the RF amplifier 42 provides a substantially constant gain across the input power levels shown. For the full bandwidth curve 58, the envelope power supply signal EPS may sweep across a voltage spanning >4.0 V. In cases where the frequency of such voltage changes is very high, the envelope power converter circuitry 54 may not be capable of changing voltages across such a broad range as quickly as is necessary to adequately track the envelope of a signal. Accordingly, a number of different reduced bandwidth curves are shown. A first reduced bandwidth curve 60 shown as a dotted line remains substantially constant for input power levels below −20 dBm, then begins to follow the full bandwidth curve 58. A second reduced bandwidth curve 62 shown as a dashed line remains substantially constant for input power levels below −10 dBm, then begins to follow the full bandwidth curve 58. A third reduced bandwidth curve 64 shown as a mixed dashed and dotted line remains substantially constant for input power levels below −5 dBm, then beings to follow the full bandwidth curve 58. A fourth reduced bandwidth curve 66 remains substantially constant for input power levels below −2.5 dBm, then beings to follow the full bandwidth curve 58. An average power tracking curve 68 remains constant throughout the entirety of the input power range.

As discussed above, the envelope power converter circuitry 54 may be designed to provide maximum efficiency when operated using the full bandwidth curve 58. Accordingly, the envelope power converter circuitry 54 may not be capable of sustaining the envelope power supply signal EPS at the voltage level indicated by the average power tracking curve 68 for long periods of time. In order to use an average power tracking scheme, it may therefore be necessary to design the envelope power converter circuitry 54 to be capable of sustaining these voltages. However, the efficiency of the envelope power converter circuitry 54 will be significantly degraded if designed as such. Accordingly, additional power converter circuitry could be separately used for average power tracking, however, this will consume valuable real estate in a device incorporating the RF transmitter 36. By using the reduced bandwidth curves discussed above, the voltage range across which rapid change may be required by the envelope power converter circuitry 54 is significantly reduced. Accordingly, the envelope power converter circuitry 54 may be capable of accurately tracking the envelope of the RF input signal RF_IN even for wide bandwidth signals.

In one embodiment, the required bandwidth is reduced as much as possible, such that a reduced bandwidth curve such as the fourth reduced bandwidth curve 66 is used. In other words, the largest possible voltage sustainable by the envelope power converter circuitry 54 is used in order to reduce the voltage swing of the envelope power supply signal EPS. In the example shown in FIG. 5, the envelope power converter circuitry 54 may be capable of providing a sustained 3.9 V, with occasional brief periods of higher voltages, but cannot support a sustained 4.6 V as required by the average power tracking curve 68. Accordingly, the fourth reduced bandwidth curve 66 allows the envelope power converter circuitry 54 to support the highest bandwidth signals.

Figure 2A:
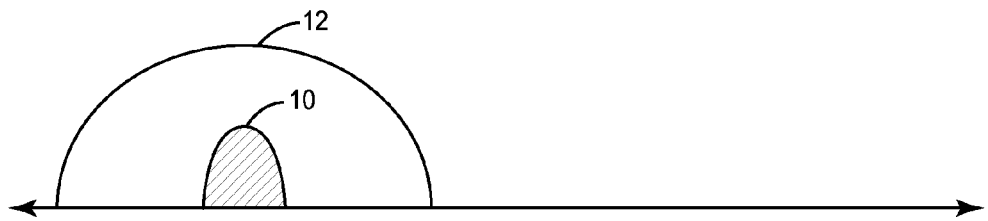
FIGS. 2A through 2D are diagrams illustrating various carrier aggregation configurations.
Figure 2B:
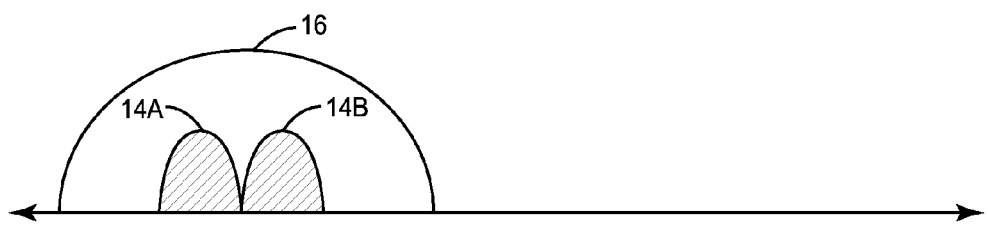
Figure 2C:
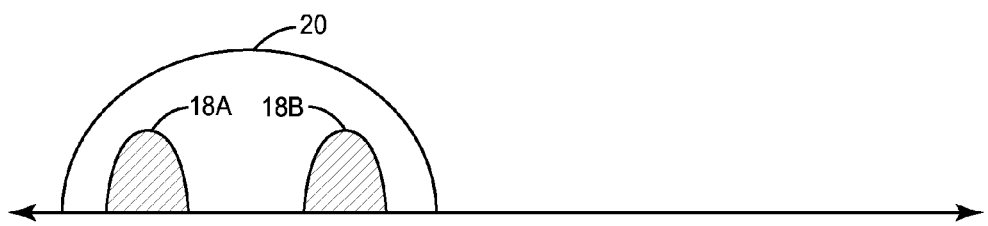
Figure 2D:
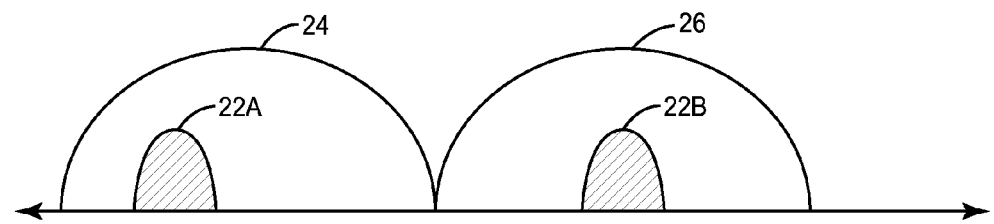
Figure 3:
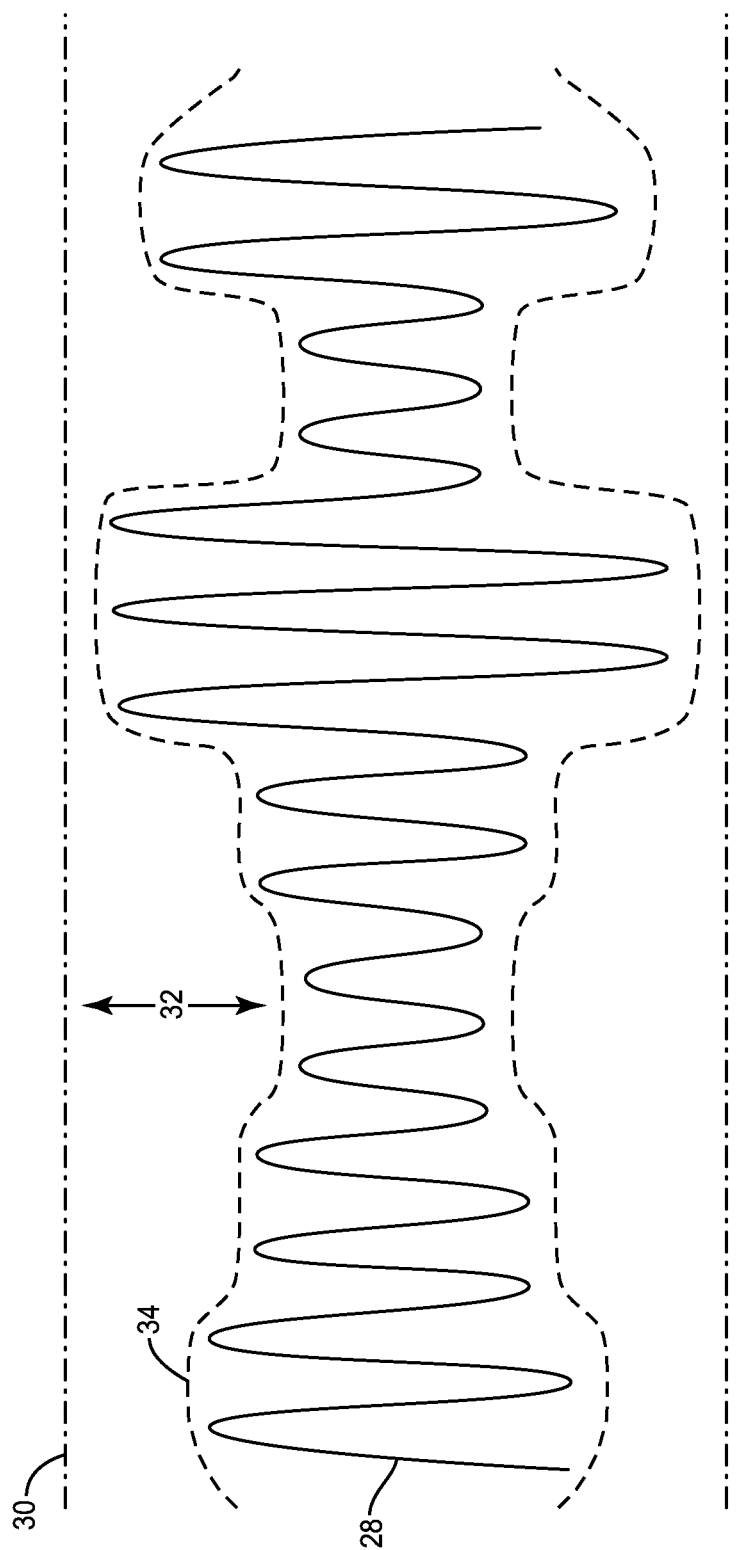
FIG. 3 is a plot illustrating envelope tracking techniques.
Figure 6:
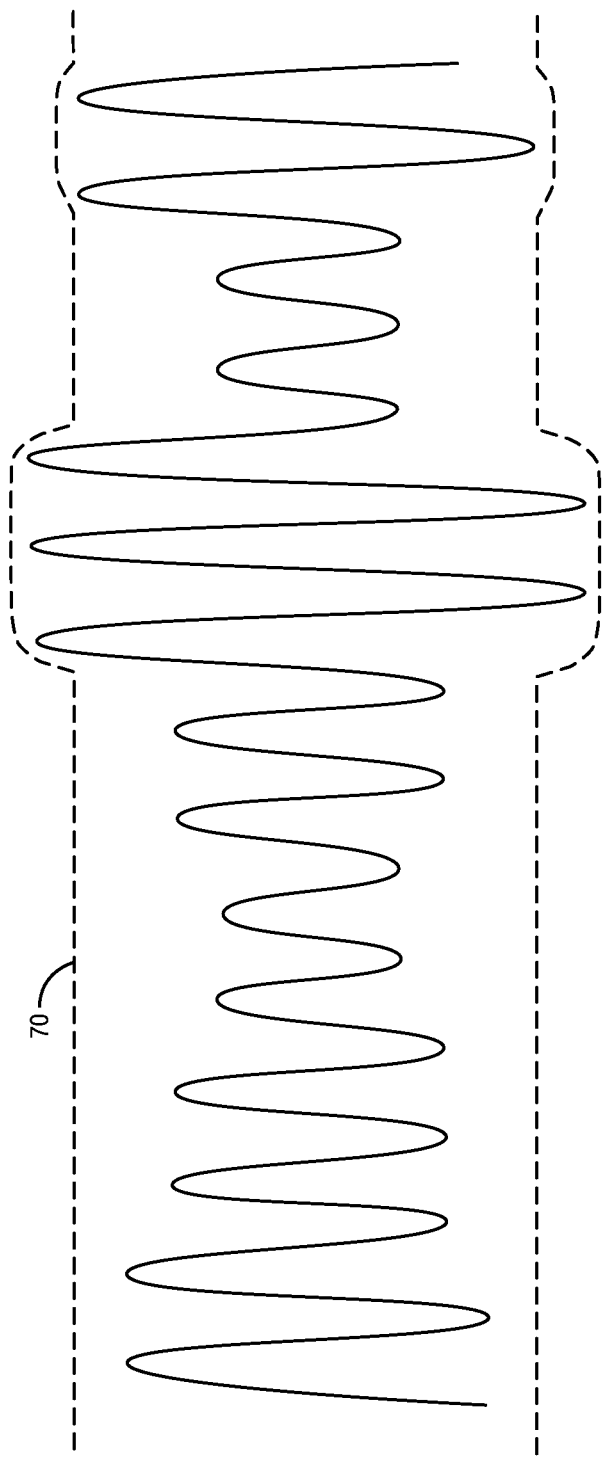
FIG. 6 is a plot illustrating the power modulation technique shown in FIG. 4 according to one embodiment of the present disclosure.

FIG. 6 is a graph illustrating the bandwidth reduction techniques discussed above. FIG. 6 shows the same amplitude modulated RF signal 28 discussed above with respect to FIG. 3. Line 70 illustrates the reduced bandwidth envelope modulation technique, wherein for input power levels of the amplitude modulated RF signal 28 below a predetermined threshold, the voltage level of an envelope power supply signal remains relatively constant. When the input power exceeds the predetermined threshold, the envelope power supply signal tracks the envelope of the signal. Since this only occurs for brief periods of time, the envelope power converter circuitry 54 is able to provide such voltages.

Figure 7:
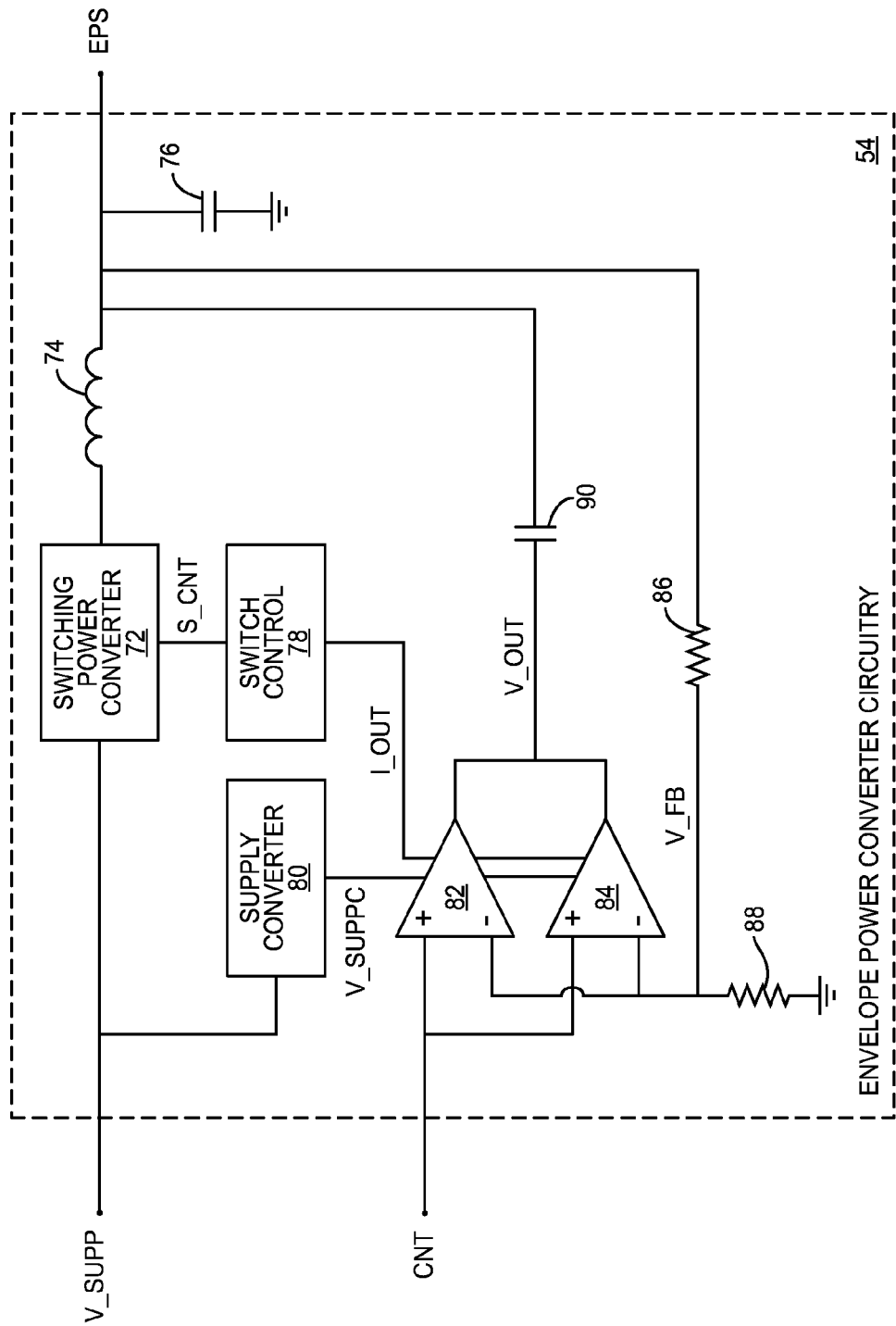
FIG. 7 is a diagram illustrating an envelope power supply according to one embodiment of the present disclosure.

FIG. 7 shows details of the envelope power converter circuitry 54 according to one embodiment of the present disclosure. The envelope power converter circuitry 54 includes switching power converter circuitry 72 configured to receive the supply voltage V_SUPP and provide a stepped-up or stepped-down version thereof to a holding inductor 74 and a smoothing capacitor 76 based on a switching control signal S_CNT provided by switching control circuitry 78. Supply voltage converter circuitry 80 also receives the supply voltage V_SUPP and provides a converted supply voltage V_SUPPC to a first control amplifier 82 and second control amplifier 84. The first control amplifier 82 and the second control amplifier 84 both additionally receive the envelope power converter control signal CNT. Further, the first control amplifier 82 and the second control amplifier 84 both receive a feedback signal V_FB via a voltage divider formed from an isolation resistance 86 and a divider resistance 88 from an output of the envelope power converter circuitry 54. As will be appreciated by those of ordinary skill in the art, the first control amplifier 82 and the second control amplifier 84 may be operational amplifiers configured to equalize the envelope power converter control signal CNT received at the non-inverting input thereof and the feedback signal V_FB received at the inverting input thereof. The first control amplifier 82 and the second control amplifier 84 may do this by changing an output voltage V_OUT and an output current I_OUT provided therefrom. The output current I_OUT from the first control amplifier 82 and the second control amplifier 84 may be provided to the switching control circuitry 78, which generates the switching control signal S_CNT based thereon. The output voltage V_OUT of the first control amplifier 82 and the second control amplifier 84 may be delivered to an output of the envelope power converter circuitry 54 via a bypass capacitor 90, such as at the output of the holding inductor 74.

The holding inductor 74 may be a relatively large inductor (e.g., around 2.2 µH) in order to adequately store energy to provide the envelope power supply signal EPS. Accordingly, the holding inductor 74, along with other components in the envelope power converter circuitry 54, may limit the speed at which the envelope power supply signal EPS can be adjusted, thereby limiting the frequency of operation thereof as discussed above.

In general, the switching power converter circuitry 72 provides the majority of the envelope power supply signal EPS via the holding inductor 74 based on control signals provided by one of the first control amplifier 82 and the second control amplifier 84. In situations in which the switching power converter circuitry 72 cannot provide a desired magnitude of the envelope power supply signal EPS, for example, due to a very high modulation bandwidth of the RF input signal RF_IN, one of the first control amplifier 82 and the second control amplifier 84 may supplement the output of the switching power converter circuitry 72 by sinking voltage from the bypass capacitor 90.

In the first mode of operation of the envelope power supply circuitry 48, the first control amplifier 82 is active and provides the output current I_OUT to the switching control circuitry 78. In the second mode of operation of the envelope power supply circuitry 48, the second control amplifier 84 is active and provides output current I_OUT to the switching control circuitry 78. Due to the fact that in the second mode of operation the necessary voltage swing of the envelope power converter circuitry 54 is significantly reduced, the voltage provided to the second control amplifier 84 by the supply voltage converter circuitry 80 may also be proportionately reduced. While this may save power in the envelope power converter circuitry 54, the second control amplifier 84 must be designed to operate at this lower supply voltage to avoid distortion. Accordingly, the second control amplifier 84 may be designed to operate at a lower supply voltage than the first control amplifier 82 in order to support such power saving measures.

Figure 8:
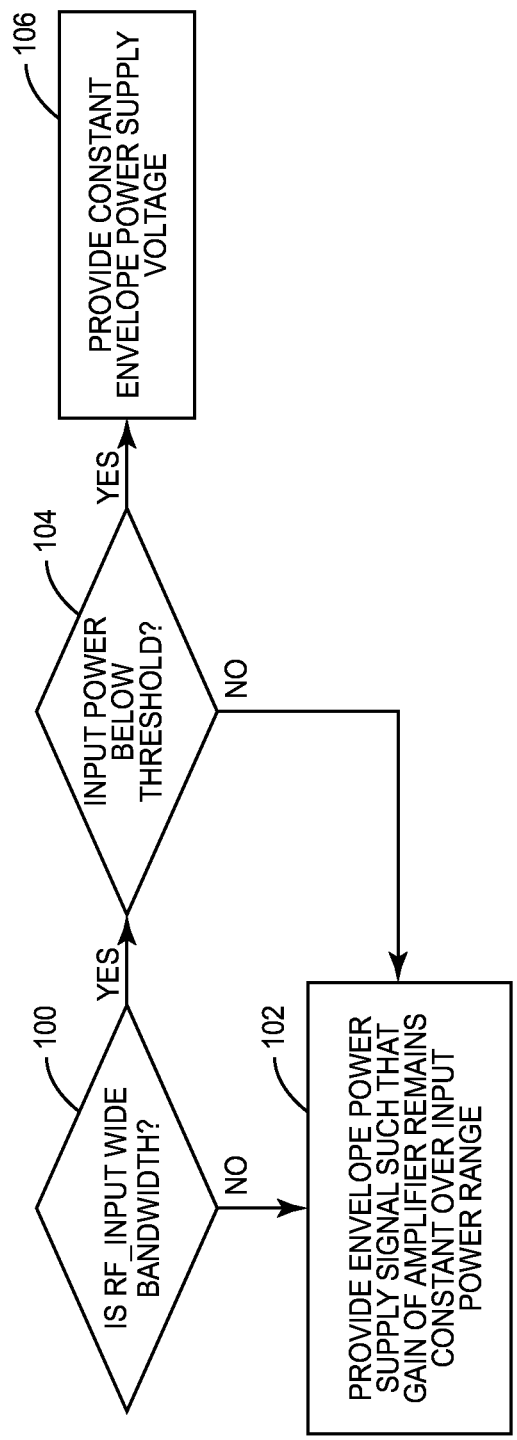
FIG. 8 is a flow diagram illustrating a method of operating envelope power supply circuitry according to one embodiment of the present disclosure.

FIG. 8 is a flow diagram illustrating the principles discussed above. First, a decision is made regarding whether or not the RF input signal RF_INPUT is a wide bandwidth signal (step 100). If the RF input signal RF_INPUT is not a wide bandwidth signal, the envelope power supply signal EPS is provided such that the gain of the amplifier remains substantially constant over the input power range of the RF input signal RF_INPUT (step 102). If the RF input signal RF_INPUT is a wide bandwidth signal, a decision is then made regarding whether the input power is below a predetermined threshold (step 104). If the input power of the RF input signal RF_IN is below the predetermined threshold, the envelope power supply signal EPS is provided as a constant voltage (step 106). If the input power of the RF input signal RF_IN is above the predetermined threshold, the process returns to step 102 and the envelope power supply signal EPS is provided such that the gain of the amplifier remains substantially constant over the input power range of the RF input signal RF_INPUT.

Those skilled in the art will recognize improvements and modifications to the embodiments of the present disclosure. All such improvements and modifications are considered within the scope of the concepts disclosed herein and the claims that follow.

What is claimed is:

1. Envelope power supply circuitry comprising:
    envelope power converter circuitry configured to receive an envelope power converter control signal and a supply voltage and provide an envelope power supply signal for an amplifier based on the envelope power converter control signal; and
    envelope tracking circuitry configured to provide the envelope power converter control signal to the envelope power supply circuitry, wherein:
        in a first mode of operation in which a modulation bandwidth of an RF input signal provided to the amplifier is below a modulation bandwidth threshold, the envelope power converter control signal is provided such that the envelope power supply signal causes a gain of the amplifier to remain substantially constant over a range of input power provided to the amplifier; and
        in a second mode of operation in which the modulation bandwidth of the RF input signal provided to the amplifier is above the modulation bandwidth threshold, the envelope power converter control signal is provided such that:
            the envelope power supply signal remains substantially constant for values within the range of input power below a predetermined threshold; and
            the envelope power supply signal causes the gain of the amplifier to remain substantially constant for values within the range of input power above the predetermined threshold.

2. The circuitry of claim 1 wherein the envelope tracking circuitry comprises a gain-shaping look-up table configured to receive an envelope tracking signal and provide the envelope power converter control signal.

3. The circuitry of claim 2 wherein the envelope tracking circuitry further comprises envelope detection circuitry configured to detect an envelope of an input signal provided to the amplifier to provide the envelope tracking signal.

4. The circuitry of claim 2 wherein the envelope power converter circuitry comprises:
    switching power supply circuitry configured to provide an output current based on a switching control signal;
    switching control circuitry configured to generate the switching control signal based on a control amplifier output signal;
    a first control amplifier configured to receive the envelope power converter control signal and provide the control amplifier output signal in the first mode of operation; and a second control amplifier configured to receive the envelope power converter control signal and provide the control amplifier output signal in the second mode of operation.

5. The circuitry of claim 4 wherein the second control amplifier is configured to operate at a lower supply voltage than the first control amplifier.

6. The circuitry of claim 5 wherein the envelope power converter circuitry further comprises:
a holding inductor coupled between an output of the switching power supply circuitry and an output of the envelope power converter circuitry; and
a smoothing capacitor coupled between an output of the envelope power converter circuitry and ground.

7. The circuitry of claim 1 wherein the envelope power converter circuitry comprises:
a first control amplifier configured to receive the envelope power converter control signal and provide a first control amplifier output signal that determines a magnitude of the envelope power supply signal in the first mode of operation; and
a second control amplifier configured to receive the envelope power converter control signal and provide a second control amplifier output signal that determines the magnitude of the envelope power supply signal in the second mode of operation.

8. The circuitry of claim 7 wherein the second control amplifier is configured to operate at a lower supply voltage than the first control amplifier.

9. The circuitry of claim 8 wherein the envelope power converter circuitry further comprises:
a holding inductor coupled between an output of the switching power supply circuitry and an output of the envelope power converter circuitry; and
a smoothing capacitor coupled between an output of the envelope power converter circuitry and ground.

10. A radio frequency (RF) transmitter comprising:
modulator circuitry configured to receive a baseband signal and provide an RF input signal;
an amplifier configured to receive and amplify the RF input signal using an envelope power supply signal to provide an RF output signal;
front end circuitry configured to receive the RF output signal and provide the RF output signal to an antenna for transmission;
envelope power converter circuitry configured to receive an envelope power converter control signal and a supply voltage and provide the envelope power supply signal; and
envelope tracking circuitry configured to provide the envelope power converter control signal to the envelope power supply circuitry, wherein:
in a first mode of operation in which a modulation bandwidth of the RF input signal is below a modulation bandwidth threshold, the envelope power converter control signal is provided such that the envelope power supply signal causes a gain of the amplifier to remain substantially constant over a range of input power provided to the amplifier; and
in a second mode of operation in which the modulation bandwidth of the RF input signal is above the modulation bandwidth threshold, the envelope power converter control signal is provided such that:
the envelope power supply signal remains substantially constant for values within the range of input power below a predetermined threshold; and
the envelope power supply signal causes the gain of the amplifier to remain substantially constant for values within the range of input power above the predetermined threshold.

11. The RF transmitter of claim 10 wherein the envelope power supply circuitry is configured to operate in the second mode of operation during non-contiguous carrier aggregation.

12. The RF transmitter of claim 10 wherein the envelope tracking circuitry comprises a gain-shaping look-up table configured to receive an envelope tracking signal and provide the envelope power converter control signal.

13. The RF transmitter of claim 12 wherein the envelope tracking circuitry further comprises envelope detection circuitry configured to detect an envelope of an input signal provided to the amplifier to provide the envelope tracking signal.

14. The RF transmitter of claim 12 wherein the envelope power converter circuitry comprises:
switching power supply circuitry configured to provide an output current based on a switching control signal;
switching control circuitry configured to generate the switching control signal based on a control amplifier output signal;
a first control amplifier configured to receive the envelope power converter control signal and provide the control amplifier output signal in the first mode of operation; and
a second control amplifier configured to receive the envelope power converter control signal and provide the control amplifier output signal in the second mode of operation.

15. The RF transmitter of claim 14 wherein the second control amplifier is configured to operate at a lower supply voltage than the first control amplifier.

16. The RF transmitter of claim 15 wherein the envelope power converter circuitry further comprises:
a holding inductor coupled between an output of the switching power supply circuitry and an output of the envelope power converter circuitry; and
a smoothing capacitor coupled between an output of the envelope power converter circuitry and ground.

17. The RF transmitter of claim 10 wherein the envelope power converter circuitry comprises:
a first control amplifier configured to receive the envelope power converter control signal and provide a first control output current that determines a magnitude of the envelope power supply signal in the first mode of operation; and
a second control amplifier configured to receive the envelope power converter control signal and provide a second control output current that determines the magnitude of the envelope power supply signal in the second mode of operation.

18. The RF transmitter of claim 17 wherein the second control amplifier is configured to operate at a lower supply voltage than the first control amplifier.

19. The RF transmitter of claim 18 wherein the envelope power converter circuitry further comprises:
a holding inductor coupled between an output of the switching power supply circuitry and an output of the envelope power converter circuitry; and
a smoothing capacitor coupled between an output of the envelope power converter circuitry and ground.

20. A method comprising:
in a first mode of operation of envelope power supply circuitry in which a modulation bandwidth of an RF input signal to an amplifier is below a modulation bandwidth threshold, providing an envelope power supply signal to the amplifier such that a gain of the amplifier remains substantially constant over a range of input power to the amplifier; and in a second mode of operation of the envelope power supply circuitry in which the modulation bandwidth of the RF input signal provided to the amplifier is above the modulation bandwidth threshold, providing the envelope power supply signal to the amplifier such that:

for values within the range of input power below a predetermined threshold, the envelope power supply signal remains substantially constant; and for values within the range of input power above the predetermined threshold, the gain of the amplifier remains substantially constant.

* * * * *